(12) United States Patent
Saito et al.

(10) Patent No.: US 9,416,022 B2
(45) Date of Patent: Aug. 16, 2016

(54) METHOD FOR PREPARING BISMUTH IODIDE ARTICLE AND METHOD FOR MANUFACTURING RADIATION DETECTING ELEMENT

(71) Applicant: CANON KABUSHIKI KAISHA, Tokyo (JP)

(72) Inventors: Tatsuya Saito, Kawasaki (JP); Tatsuya Iwasaki, Machida (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/538,678

(22) Filed: Nov. 11, 2014

(65) Prior Publication Data

US 2015/0129771 A1    May 14, 2015

(30) Foreign Application Priority Data

Nov. 13, 2013 (JP) ................. 2013-234962
May 13, 2014 (JP) ................. 2014-099900
Oct. 15, 2014 (JP) ................. 2014-210842

(51) Int. Cl.
*C01G 29/00* (2006.01)
*C23C 14/24* (2006.01)
*C23C 14/06* (2006.01)

(52) U.S. Cl.
CPC ............ *C01G 29/00* (2013.01); *C23C 14/0694* (2013.01); *C23C 14/24* (2013.01); *C01P 2006/40* (2013.01); *C01P 2006/80* (2013.01); *Y10T 29/49117* (2015.01)

(58) Field of Classification Search
CPC .... C01G 29/00; C23C 14/0694; C23C 14/24; C01P 2006/40; C01P 2006/80; Y10T 29/49117
See application file for complete search history.

(56) References Cited

FOREIGN PATENT DOCUMENTS

| JP | 08222524 A | 8/1996 |
|---|---|---|
| JP | 2005327817 A | 11/2005 |
| JP | 4237652 B2 | 3/2009 |

OTHER PUBLICATIONS

Azaree T. Lintereur; Nuclear Instruments and Methods in Physics Research A; Characterization of bismuth tri-iodide single crystals for wide band-gap semiconductor radiation detectors; 652 (2011) 166-169; Gainesville, FL.
Semiconductors for Room temperature Nuclear Detector Applications; p500, academic pres.

*Primary Examiner* — Mark R Gaworecki
(74) *Attorney, Agent, or Firm* — Canon U.S.A., Inc., IP Division (57) ABSTRACT

A method for preparing a bismuth iodide article includes heat-treating bismuth iodide at a temperature less than the melting point of bismuth iodide in an atmosphere containing iodine.

8 Claims, 11 Drawing Sheets

METHOD FOR PREPARING BISMUTH IODIDE ARTICLE AND METHOD FOR MANUFACTURING RADIATION DETECTING ELEMENT

BACKGROUND OF THE INVENTION

1. Field of the Invention

The present invention relates to methods for preparing a bismuth iodide article and for manufacturing a radiation detecting element.

2. Description of the Related Art

For medical practice and industrial application, radiation detectors have been studied which include a radiation detecting element including a conversion layer made of a heavy metal halide, such as lead iodide ($PbI_2$), mercury iodide ($HgI_2$) or bismuth iodide ($BiI_3$). It is generally known that a conversion layer made of a heavy metal halide having a halogen defect has a low resistance and reduces signal current that will be detected by the radiation detecting element. The term signal current mentioned herein refers to the value obtained by subtracting the current value under a non-irradiation condition from the current value under an irradiation condition.

Japanese Patent Laid-Open No. 2005-327817 discloses a technique for reducing halogen defects by adding a halogen as well as a heavy metal halide to a detection layer so as to suppress the dissociation of the halogen from the heavy metal halide caused by X-ray irradiation. In addition, a process is disclosed of adding a halogen as well as the heavy metal halide to the detection layer by depositing lead iodide in iodine vapor.

It has been however found that when bismuth iodide is deposited in iodine vapor for forming a bismuth iodide detection layer, the deposition rate is considerably reduced because the deposition is performed under a high pressure produced by iodine vapor. Hence, it takes a long time to form a bismuth iodide layer having a thickness sufficient to absorb radiation.

SUMMARY OF THE INVENTION

Accordingly, a method for preparing a bismuth iodide article is provided. The method includes heat-treating bismuth iodide at a temperature less than the melting point of bismuth iodide in an atmosphere containing iodine.

Further features of the present invention will become apparent from the following description of exemplary embodiments with reference to the attached drawings.

DESCRIPTION OF THE EMBODIMENTS

The following first and second embodiments will describe a method for manufacturing a radiation detecting element including a conversion layer made of a bismuth iodide article having a high resistivity prepared by a method different from the method disclosed in Japanese Patent Laid-Open No. 2005-327817, and a method for preparing the bismuth iodide article of the conversion layer.

First Embodiment

A first embodiment will describe a radiation detector including a bismuth iodide conversion layer that converts incoming radiation into an electric signal and a method for manufacturing the radiation detector. In the present embodiment, the radiation detector detects radiation in a current mode. The radiation detector of the present embodiment includes a conversion layer made of bismuth iodide. This bismuth iodide has been heat-treated at a temperature less than the melting point of bismuth iodide in an atmosphere containing iodine (hereinafter referred to as an iodine atmosphere). The present inventors have found that this heat treatment increases the resistivity of bismuth iodide and, in addition, increases signal current. The present inventors think that this is because the heat treatment reduces iodine defects in the bismuth iodide. Iodine defects in bismuth iodide are a cause of excess carriers that will reduce the resistance of the bismuth iodide and a carrier trap level that will reduce signal current. The present inventors have also found from their studies that the heat treatment increases the mobility of holes. More specifically, bismuth iodide having a hole mobility higher than 1/10 of the electron mobility can be produced by the heat treatment. For the following description, bismuth iodide before heat treatment may be referred to as first bismuth iodide and the bismuth iodide having been subjected to the heat treatment may be referred to as second bismuth iodide.

An embodiment of the present invention will now be described. The method for producing a radiation detector according to the present embodiment includes the step of heat-treating bismuth iodide (first bismuth iodide) at a temperature less than the melting point of bismuth iodide in an atmosphere containing iodine. The first bismuth iodide may be in any state. For example, it may be in a bulk state, such as monocrystalline crystals, or may be in a film on a substrate. In the case of a film, it is advantageous that the bismuth iodide film is disposed on an electrically conductive substrate. In this instance, the substrate can be used as an electrode. On the surface of this conductive substrate opposite the bismuth iodide film, an electrically conductive member connected to a signal processing unit may be disposed. In the embodiments described herein and in the application, the conductive substrate and the conductive member in such a structure each act as an electrode. The first bismuth iodide may be subjected to the heat treatment before or after being electrically connected to the electrodes. Alternatively, the heat treatment may be performed on the first bismuth iodide electrically connected to one of the electrodes.

The operation of the heat treatment may be performed as below. Bismuth iodide ($BiI_3$), or first bismuth iodide, and solid iodine are placed in a container, and the container is evacuated and sealed into an air-tight container. The air-tight container is heated so as to sublimate the iodine. Since iodine has a higher vapor pressure than $BiI_3$, iodine sublimates preferentially when the temperature in the container is increased. Thus, the first bismuth iodide can be heat-treated in an iodine atmosphere. In this instance, if the temperature of the first bismuth iodide in the container is increased to the melting point of $BiI_3$ or higher, the melting of $BiI_3$ proceeds. The air-tight container is therefore heated so that that the temperature of the first bismuth iodide can be less than the melting point of $BiI_3$. Also, since $BiI_3$ sublimates in part even at a temperature less than or equal to the melting point thereof, it is desirable that the container is heated so that the temperature of the first bismuth iodide can be 200° C. or less to suppress the sublimation of the first bismuth iodide. In contrast, if the temperature in the container is low, part of the iodine cannot be sublimated, the amount of iodine sublimated is undesirably reduced. The container is desirably heated so that the temperature of the iodine in the container can be increased to 100° C. or more. Also, if the surface temperature of the first bismuth iodide is lower than or equal to the sublimation temperature of iodine, iodine is deposited on the surface of the first bismuth iodide. Accordingly, the surface temperature of the first bismuth iodide is desirably higher than or equal to the sublimation temperature of iodine, such as 100° C. or more. Bismuth iodide $BiI_3$ used in the embodiments described herein and of the present application is not limited to the composition in which the mole ratio of Bi to I is strictly 1:3. In bismuth iodide having iodine defects, for example, the mole ratio of Bi to I is not 1:3 in a strict sense. Such bismuth iodide may be expressed by $BiI_3$ in the description herein.

Instead of sublimating solid iodine in an air-tight container containing first bismuth iodide and the iodine, a container containing first bismuth iodide may be filled with iodine gas and then sealed into an air tight container, followed by heating.

For the heat treatment in the air-tight container, the temperatures of the first bismuth iodide and the iodine are considered to be the same in the container, as long as the container does not have a temperature gradient therein. Hence, in the case where the container does not have a temperature gradient therein, the temperature in the container is set in the range of 100° C. to 200° C. so that the first bismuth iodide temperature in the container can be 200° C. or less and the iodine temperature in the container can be 100° C. or more.

If the partial pressure of the iodine in the air-tight container during heating is excessively high, the container can be broken; if it is excessively low, the resistivity of the first bismuth iodide and the signal current cannot be increased as expected. Desirably, the partial pressure of the iodine in the air-tight container is in the range of $5.0 \times 10^{-3}$ MPa to $1.5 \times 10^{-1}$ MPa.

When the temperature in the air-tight container is reduced after the heat treatment, the vapor of the iodine in the container turns into solid and is thus deposited on a portion where the temperature is reduced. If the temperature in the region where the second bismuth iodide is placed is reduced with the vapor of the iodine filling the container, the iodine is deposited on the surface of the second bismuth iodide. In order to prevent iodine from being deposited on the surface of the second bismuth iodide, the step of depositing iodine in the air-tight container may be performed. This step is performed after the step of heat treatment.

The step of depositing iodine is performed by controlling the temperature in the air-tight container so that the temperature of the region of the air-tight container where the second bismuth iodide is not placed is lower than the temperature of the region where the second bismuth iodide is placed. Thus iodine is deposited in the region where the second bismuth iodide is not placed. Then, after the vapor of iodine is reduced in the container, the temperature of the region where the second bismuth iodide is placed is reduced. Thus the iodine is prevented from being deposited on the surface of the second bismuth iodide. In order to control the temperature in the container so that the temperature of the region where the second bismuth iodide is not placed is lower than the temperature of the region where the second bismuth iodide is placed, a temperature gradient may be applied to the interior of the air-tight container so that the temperature of the region where the second bismuth iodide is placed can be higher than the temperature of the other region.

The first embodiment will be further described in more detail with reference to the drawings. In the drawings, the same parts are designated by the same reference numerals and thus description thereof is omitted.

Figure 1A:
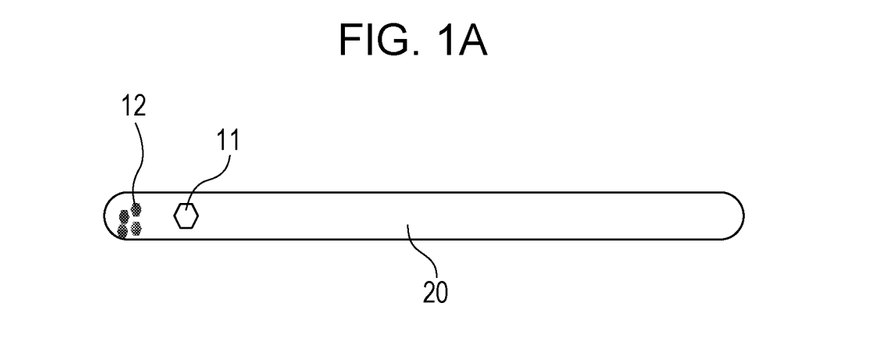
FIGS. 1A to 1C are diagrammatic representations illustrating a method for preparing a bismuth iodide article according to a first embodiment.
Figure 1B:
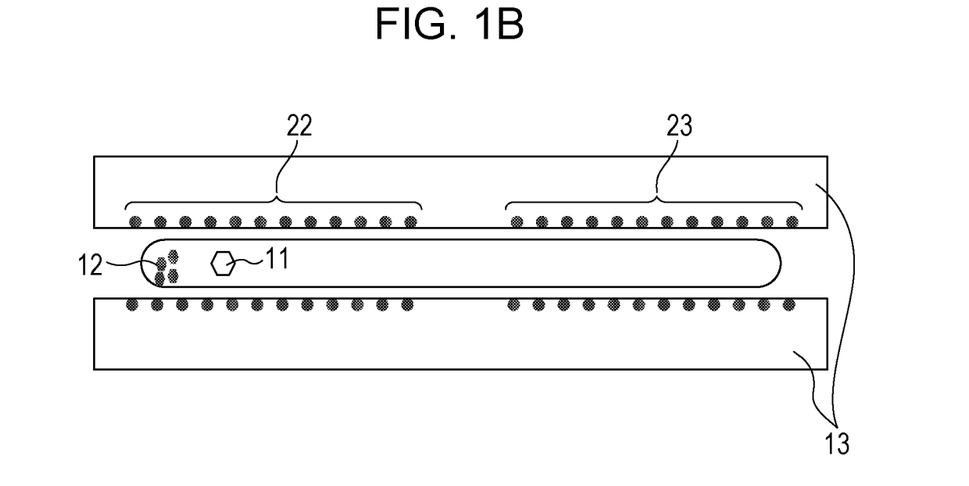
Figure 1C:
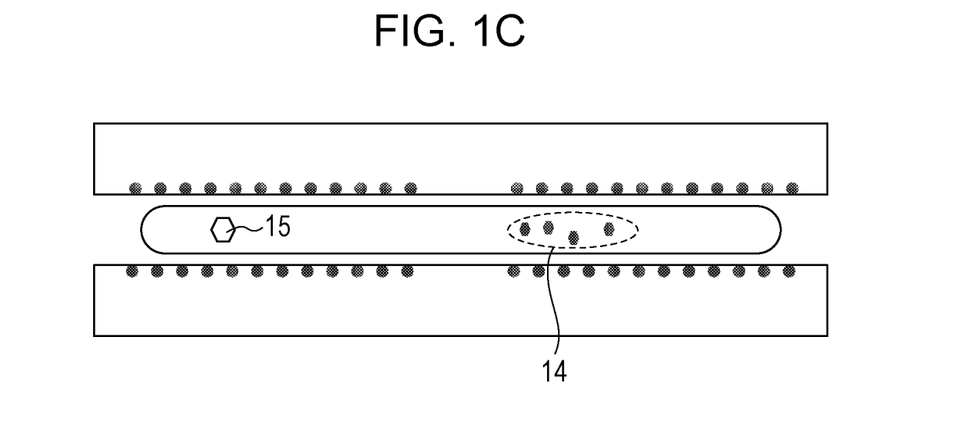

FIGS. 1A to 1C are diagrammatic representations illustrating a method for preparing a bismuth iodide article (second bismuth iodide) according to the present embodiment. As shown in FIG. 1A, a quartz tube 20 is used as the container. $BiI_3$ (first bismuth iodide) 11 and iodine 12 are added into the quartz tube 20, and the tube 20 is evacuated and air-tightly sealed. The first bismuth iodide may be in monocrystalline crystals or a film on a substrate. Monocrystalline $BiI_3$ may be produced by, for example, vapor phase transport or the Bridgman method, and a $BiI_3$ film may be formed on a substrate by, for example, vapor deposition or close-space sublimation. The process for preparing the first bismuth iodide to be subjected to heat treatment is however not limited to these techniques.

Next, the quartz tube 20 is heated in an electric furnace 13, as shown in FIG. 1B. The iodine is sublimated to increase the partial pressure thereof in the quartz tube 20 by the increase of the temperature in the quartz tube 20. Thus the first bismuth iodide 11 is heat-treated in the atmosphere containing iodine.

After heating for a predetermined time, the quartz tube 20 is cooled. At this time, the temperature of the quartz tube 20 is reduced while a temperature gradient is applied to the quartz tube 20 for the step of depositing iodine in the quartz tube. The electric furnace 13 shown in FIG. 1B is of a two-zone type including a first heater 22 and a second heater 23. In this case using an electric furnace including a plurality of heaters each capable of controlling temperature, a temperature gradient can be applied to the interior of the air-tight container by controlling the output from the heaters so that the temperature of the region at the second heater 23 where the second bismuth iodide is not placed is first reduced. When temperature is reduced, the vapor of iodine turns into solid and is deposited. Thus, the iodine 14 is deposited in the region where the second bismuth iodide 15 is not placed, as shown in FIG. 1C.

The second bismuth iodide 15 shown in FIG. 1C is taken out, and a first and a second electrode are formed on this second bismuth iodide to yield a radiation detecting element including a conversion layer of the second bismuth iodide 15. The electrodes may be formed by any method without particular limitation. For example, vacuum vapor deposition, sputtering or printing of electrically conductive ink may be applied to form thin-film electrodes. The electrodes may be made of any electrically conductive material, such as Au, Pt, Mo, C or ITO, The first electrode is disposed on the side that will be irradiated to X-ray radiation, and has a thickness through which X-ray radiation is transmitted. For example, a Au first electrode may have a thickness of several nanometers to 100 nm. The thickness of the second electrode is not particularly limited. The heat treatment may be performed on the first bismuth iodide on which either the first electrode or the second electrode has been formed. If a bismuth iodide film formed on a substrate is heat-treated as mentioned above, it is advantageous that the substrate is made of an electrically conductive material that can serve as either the first electrode or the second electrode.

By heat-treating bismuth iodide in an iodine atmosphere, as in the present embodiment, the resulting bismuth iodide article exhibits a higher resistivity than bismuth iodide not subjected to the heat treatment. Also, by using the resulting bismuth iodide article as the conversion layer of a radiation detecting element, the radiation detecting element can exhibit a higher signal current when irradiated with radiation.

Probably, the cause of these effects is that iodine defects in the bismuth iodide have been compensated by the heat treatment. Also, by using the bismuth iodide article as the conversion layer of a radiation detecting element, the radiation detecting element can exhibit a higher sensitivity than the case of using bismuth iodide not subjected to heat treatment as the conversion layer. The first and the second electrode of the radiation detecting element may be electrically connected to a signal processing unit that reads signals from the electrodes for producing a radiation detector. The bismuth iodide article may be provided with a plurality of pairs of electrodes.

Figure 6:
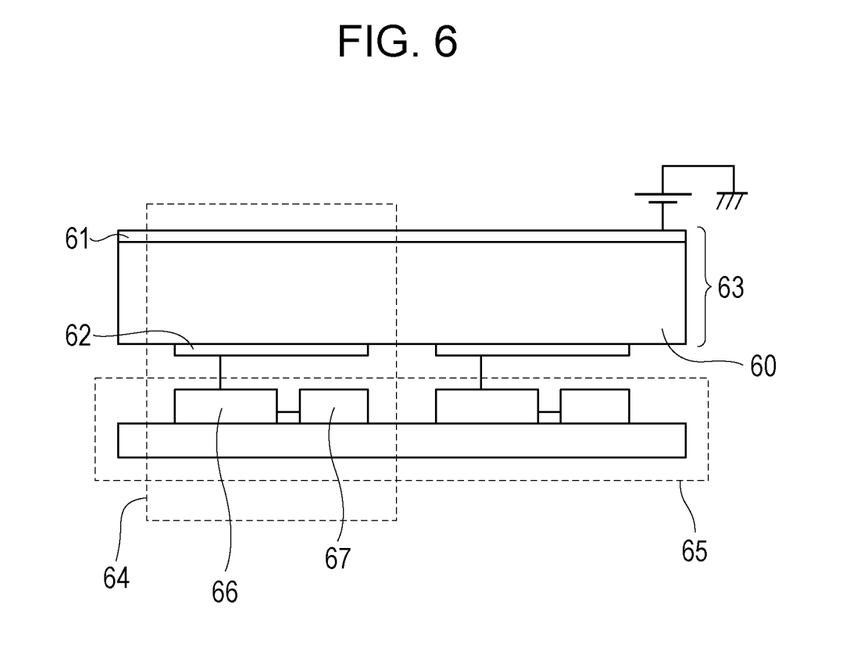
FIG. 6 is a schematic diagram of a radiation detector according to the first embodiment.

For example, as shown in FIG. 6, a radiation detecting element 63 having a structure in which a first electrode (upper electrode) 61 and second electrodes (pixel electrodes) 62 are formed on a second bismuth iodide (bismuth iodide article) 60 may be electrically connected to a signal processing unit 65 to yield a radiation detector including a plurality of pixels 64. The signal processing unit 65 includes a plurality of storage capacitors 66 and a plurality of TFTs 67. The storage capacitors are each connected to the second electrode and the TFT 67 of the corresponding pixel. The storage capacitor 66 stores signal charges from the second electrode 62 of the corresponding pixel, and the quantity of signal charges in each storage capacitor 66 is read one after the other using the corresponding TFT 67.

Iodine reacts with many metals and thus corrodes them. It is therefore generally difficult to create an iodine atmosphere in a normal vacuum container such as a stainless steel container. In the present embodiment, however, a container less reactive with iodine, such as a quartz tube, is used for heat treatment in an iodine atmosphere.

Second Embodiment

A second embodiment will describe a radiation detector that detects radiation (including X-ray radiation) by a photo counting technique (pulse mode) will now be described. The term X-ray radiation mentioned herein refers to electromagnetic waves with energy in the range of 2 keV to 1000 keV, including γ-rays in this energy range.

Figure 7:
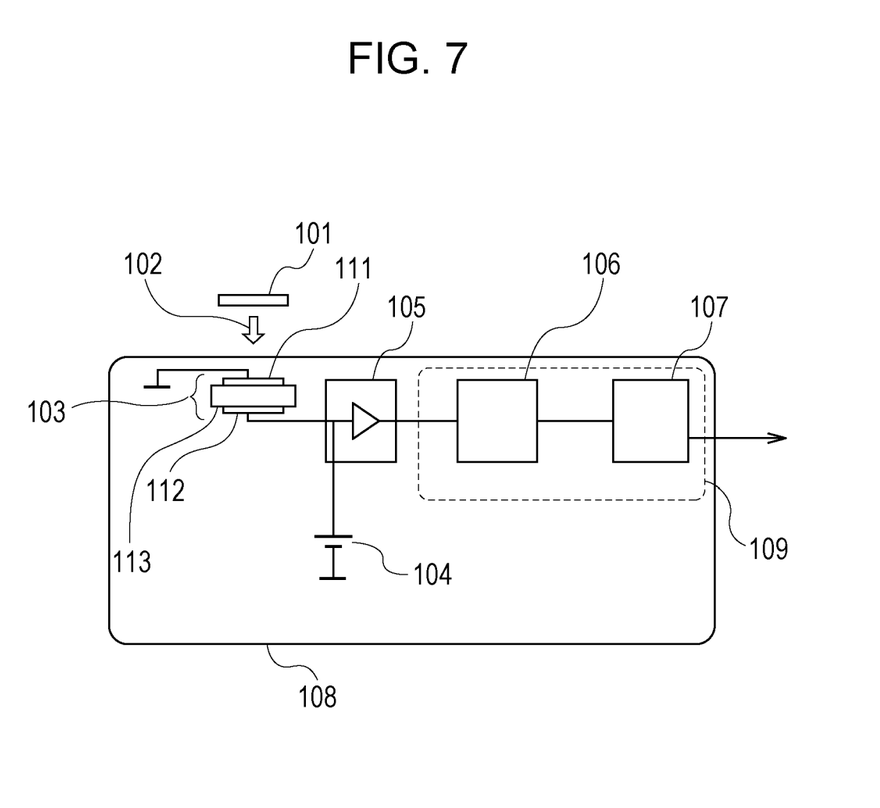
FIG. 7 is a schematic diagram of a radiation detector according to a second embodiment.

FIG. 7 is a schematic diagram of a radiation detector 108. The radiation detector 108 is the same as the radiation detector of the first embodiment in that it includes a radiation detecting element 103 that generates charges according to incoming radiation 102, and a signal processing unit. The radiation detector of the present embodiment is however different from that of the first embodiment in that the signal processing unit includes a preamplifier 105 and a pulse counter 109. The preamplifier 105 outputs pulsed electrical signals according to charges generated from the radiation detecting element 103. The pulse counter 109 counts and outputs the number of pulses of the pulsed electrical signals from the preamplifier 105. The radiation detector having such a structure can count and output the number of radiations, that is, the number of photons.

The radiation detecting element 103 includes a conversion layer 113, a first electrode 111 and a second electrode 112. The first and the second electrode are opposed to each other with the conversion layer 113 therebetween. The second electrode 112 is connected a bias supply 104. On applying a voltage to the conversion layer 113 from the bias supply 104 through the second electrode 112, an electric field is formed in the conversion layer 113, and charges are generated in the conversion layer 113 by irradiation with radiation. The charges are collected to the electrode and extracted to an external circuit. By extracting the charge quantity Q generated in the conversion layer by irradiation with radiation to an external circuit, radiation is detected. In the radiation detector of the present embodiment shown in FIG. 7, the preamplifier 105 and the pulse counter 109 act as the external circuit.

The conversion layer 113 of the radiation detecting element 103 is made of bismuth iodide. The bismuth iodide may be monocrystalline or polycrystalline. The present inventors have found that the use of the second bismuth iodide of the first embodiment as the conversion layer of a photon-counting radiation detector allows photons of radiation to be counted. In a comparison between the first and the second bismuth iodide of the first embodiment, the second bismuth iodide exhibited a higher hole mobility than the first bismuth iodide. The present inventors have found that when the bismuth iodide has a hole mobility higher than $1/10$ of the electron mobility, a photo peak can be observed in a γ-ray spectrum. It is advantageous that the hole mobility is higher than 0.46 times the electron mobility.

In the present embodiment, the conversion layer is not limited to the second bismuth iodide of the first embodiment as long as it can exhibit a hole mobility higher than $1/10$ of the electron mobility thereon. The first electrode 111 and the second electrode 112 are the same in terms of the material, thickness and forming process as in the first embodiment. In the embodiment shown in FIG. 7, the first electrode 111 is a cathode connected to the ground, and the second electrode 112 is an anode connected to the preamplifier 105. Alternatively, the anode may be connected to the ground. Also, the first electrode may be an anode and the second electrode may be a cathode.

In the preamplifier 105 connected to the radiation detecting element 103, the charge quantity Q generated in the radiation detecting element is converted into voltage. The converted voltage is output as a pulsed voltage signal to the pulse counter 109. The preamplifier may be of a voltage type or a charge-sensitive type. A charge-sensitive preamplifier is more advantageous because the waveform of the pulses is not easily affected by the capacitance of the detector.

The pulse counter 109 includes a main amplifier 106 and a multichannel analyzer 107. The main amplifier 106 can amplify pulsed signals from the preamplifier or shape the pulses of the signals. For shaping the pulses, a CR shaping circuit, an RC shaping circuit, or a combination thereof may be used. The pulsed output from the main amplifier 106 is transmitted to the multichannel analyzer 107. The multichannel analyzer 107 counts the number of pulses having a predetermined height. The count information obtained by the multichannel analyzer 107 is transmitted to the outside of the radiation detector.

The count information may be transmitted to an information processing apparatus such as a computer for producing a pulse height spectrum. In a pulse height spectrum, the vertical axis represents dN/dH (count) or the quotient of dN that is the number of pulses whose peak is present between H and H+dH by dH, and the horizontal axis represents pulse height (channel). Since the peak value of the pulsed signal is proportional to charge quantity Q, and charge quantity Q is proportional to the energy of radiation (X-ray photons), in an ideal condition, the channel, or the horizontal axis, of a pulse height spectrum corresponds to the energy of the radiation.

Thus, a main amplifier and a multichannel analyzer may constitute the pulse counter 109. However, the pulse counter 109 may have any configuration as long as it can count the number of pulses of electrical signals. For example, the number of pulses having a predetermined height can be counted by converting a pulsed signal into a digital signal with an analog-digital converter. A counter circuit and a pulse height discriminator that can discriminate pulses having a predetermined height may be used.

An isotope (γ-ray source) emits radiation (γ rays) peculiar to the source. By examining the pulse height spectrum of radiation from an isotope with the radiation detector of the present embodiment, peaks (photo peaks) corresponding to the energy of the radiation can be observed. In general, when the energy resolution of a radiation detector is high, sharp peaks can be observed in pulse height spectra. In contrast, when the energy resolution of a radiation detector is low, peaks are broad in width, and when the energy resolution is still lower, peaks are not observed. A radiation detector having an insufficient energy resolution cannot easily count photons even if it has a photon counting structure. Whether or not a photo peak can be observed is an important index of whether or not a radiation detector of a photon counting type can count photons. If a photo peak can be observed, the energy of radiation having entered the detector can be estimated from the position of the photo peak on the horizontal axis. Also, if a photo peak can be observed, radiation having a specific energy can be selectively detected by discriminating pulses using a threshold corresponding to the peak. In addition, noise can be eliminated effectively by setting a threshold at a low energy region, and accordingly the radiation detector can exhibit a high S/N ratio.

The preamplifier, the main amplifier, a wave height discriminator, the multichannel analyzer and the like may be integrated into an application specific integrated circuit (ASIC). Alternatively, a plurality of units, each including the preamplifier, a linear amplifier, a wave height discriminator, and the multichannel analyzer may be prepared so as to read signals from a plurality of radiation detectors.

Figure 8:
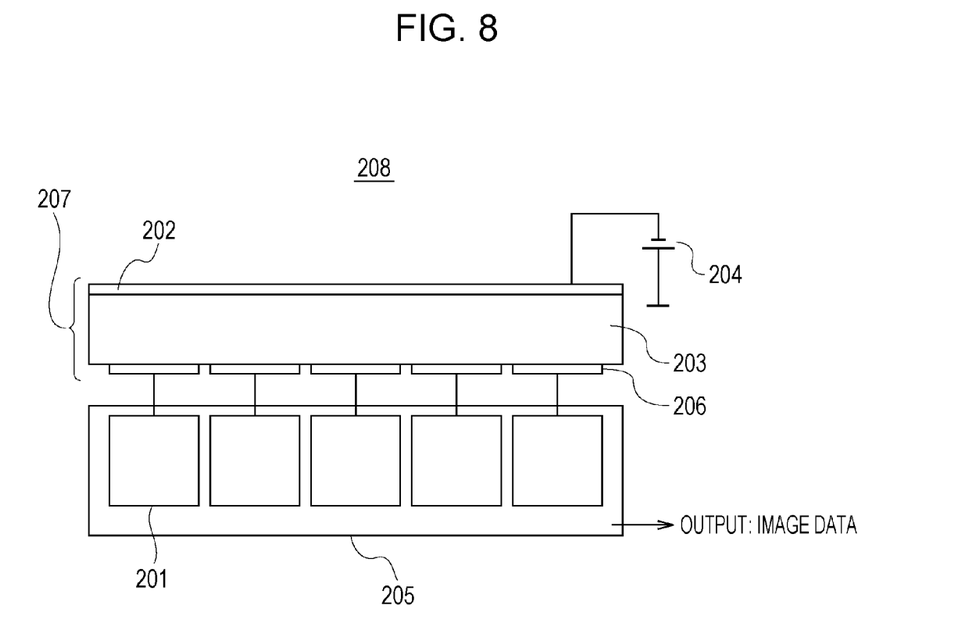
FIG. 8 is a schematic diagram of a modification of the radiation detector according to the second embodiment.

For example, a radiation detector 208 shown in FIG. 8 includes a radiation detecting element 207 and a photon counting ASIC 205. The radiation detecting element 207 includes a conversion layer 203, a first electrode acting as a common electrode 202, and second electrodes acting as pixel electrodes 206. The photon counting ASIC 205 includes a plurality of photon counting circuits 201, each including a preamplifier, a main amplifier, a wave height discriminator, and a multichannel analyzer. The photon counting circuits are each connected to the corresponding pixel electrode 206 of the radiation detecting element.

Operation modes of radiation detectors will now be described. A radiation detector may operate in a photon-counting mode, or in a current mode as in the radiation detector of the first embodiment. The current mode is a way in which an ammeter connected to a radiation detector measures the amount of radiation. In this mode, current values are recorded which are integrated and averaged over a longer time than the average time between pulses generated by irradiation with radiation quanta. Accordingly, information of the number of radiation quanta and radiation energy cannot be obtained.

On the other hand, in the photon-counting mode, each of the radiation quanta interacting with the detector is recorded. In this instance, since each radiation quantum is detected as a clearly separated single pulse, the sensitivity is increased and noise is reduced in comparison with the current mode. In particular, since the photon-counting mode is a digital measurement mode, noise can be reduced. A photon-counting radiation detector can perform detection with a high S/N ratio. If such a photon-counting detector is used as an imaging element, an image having a high S/N ratio can be formed.

Example 1

In Example 1, first bismuth iodide is heat-treated in an iodine atmosphere to yield second bismuth iodide. In the present example, monocrystalline $BiI_3$ is used as the first bismuth iodide. The second bismuth iodide prepared in the present example exhibits higher response to radiation and higher resistivity under dark conditions than the first bismuth iodide, when used as the conversion layer of a detector operated in a current mode as described in the first embodiment.

(1) Sublimation Purification of $BiI_3$

Figure 2A:
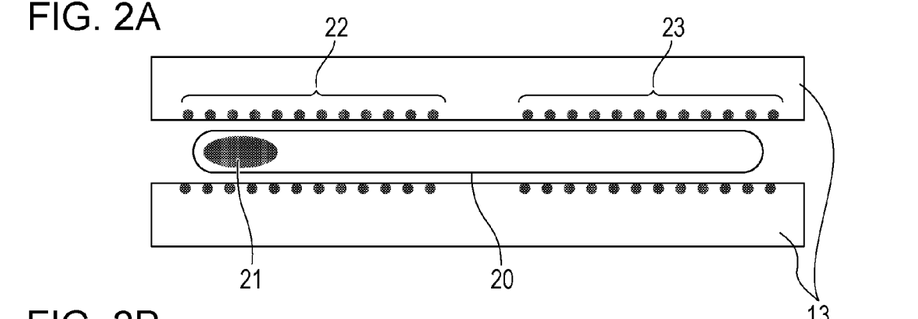
FIGS. 2A to 2D are diagrammatic representations of process steps in Example 1 for preparing monocrystalline $BiI_3$ by sublimation purification of a raw material.
Figure 2B:
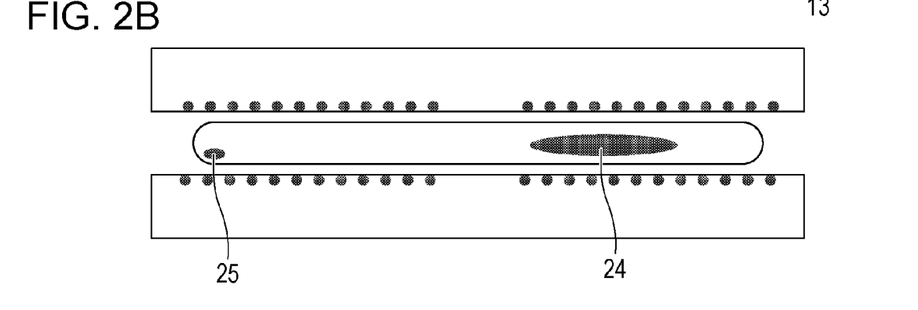

In order to remove impurities from the raw material $BiI_3$ powder (purity: 99.99%), the raw material was purified by sublimation. The raw material ($BiI_3$ powder) 21 was placed at one end in a quartz tube 20, as shown in FIG. 2A, and the tube 20 was evacuated to a pressure of $5.0 \times 10^{-3}$ Pa and then sealed into an air-tight container. Subsequently, the air-tight quartz tube 20 was set in a two-zone electric furnace 13. The first heater 22 and the second heater 23 of the two-zone electric furnace 13 each can control heating temperature. The control temperature of the first heater 22, at which the raw material 21 was located, was set to 350° C., and the control temperature of the second heater 23 was set to 200° C. The quartz tube 22 was held in this state for 3 hours. Then, the temperatures of the first and second heaters were reduced to room temperature, and the quartz tube 20 was taken out of the electric furnace 13. In the quartz tube 20 taken out of the electric furnace, $BiI_3$ 24 was deposited from the sublimated raw material in a low-temperature region at the second heater, leaving a residue 25 in a region at the first heater where the raw material had been located, as shown in FIG. 2B. The composition of the residue 25 was analyzed with an energy dispersive X-ray fluorescence analyzer, and Cu was detected. This result suggests that the deposited $BiI_3$ 24 contains less impurity (Cu) than the $BiI_3$ powder of the raw material 21, and that the raw material was purified by sublimation.

(2) Preparation of First Bismuth Iodide

Figure 2C:
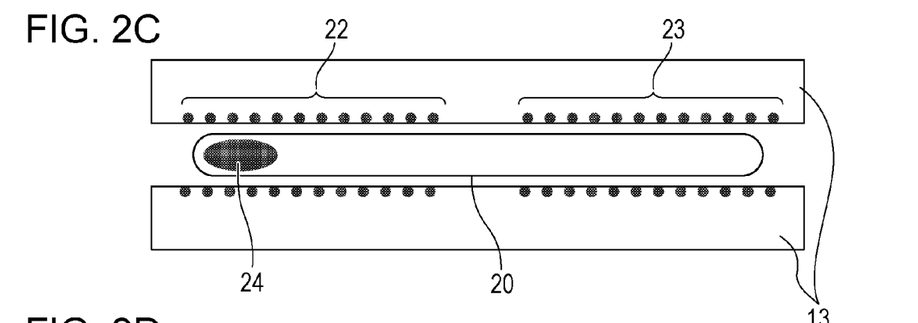
Figure 2D:
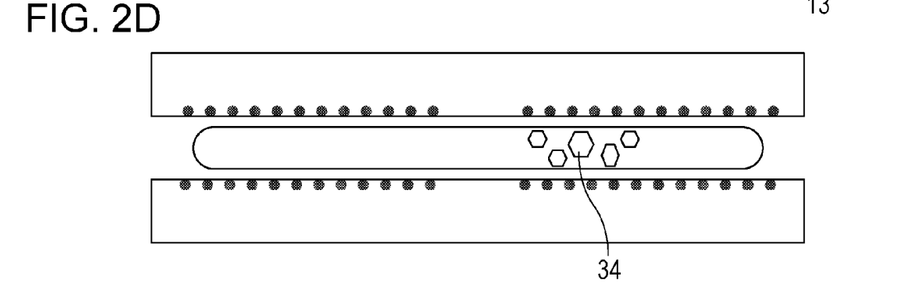

Subsequently, monocrystalline $BiI_3$ was prepared from the purified $BiI_3$. As shown in FIG. 2C, 0.5 g of the purified $BiI_3$ 24 was placed at one end in a quartz tube 20, and the quartz tube 20 was evacuated to a pressure of $5.0 \times 10^{-3}$ Pa. After argon gas was introduced into the quartz tube 20 and the tube was sealed at a pressure of $8.0 \times 10^{-2}$ MPa, the tube was set in a two-zone electric furnace 13. The control temperature of the first heater 22, at which the purified $BiI_3$ 24 was located, was set to 350° C., and the control temperature of the second heater 23 was set to 200° C. The quartz tube 20 was held in this state for 90 hours. Then, the temperatures of the first and second heaters were reduced to room temperature, and the quartz tube 20 was taken out of the electric furnace 13. In the quartz tube 20 taken out of the electric furnace, a plurality of monocrystalline $BiI_3$ crystals 34, each of a square of about 5 mm on a side with a thickness of 50 μm to 200 μm, were deposited in a low temperature region at the second heater, as shown in FIG. 2D. These monocrystalline $BiI_3$ crystals 34 were used as the first bismuth iodide.

(3) Heat Treatment of First Bismuth Iodide

Figure 3A:
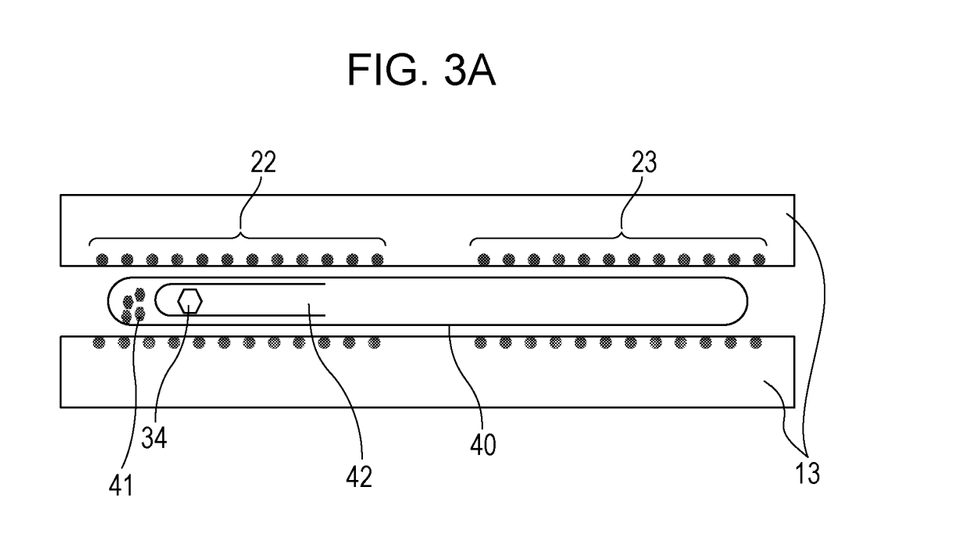
FIGS. 3A and 3B are diagrammatic representation of the process steps in Example 1 for heat-treating $BiI_3$ in an iodine atmosphere.
Figure 3B:
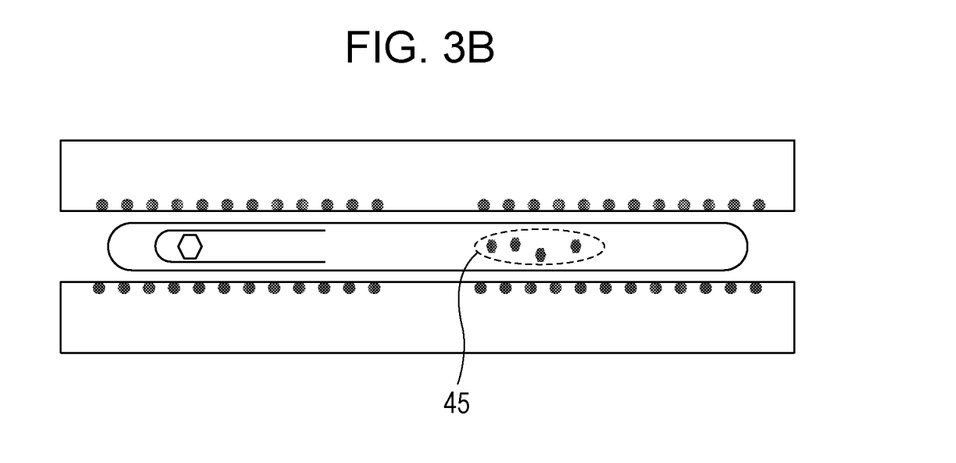

Subsequently, the resulting monocrystalline $BiI_3$ crystals 34 (first bismuth iodide) were heat-treated in an iodine atmosphere. The heat treatment was performed at a temperature lower than the melting point of $BiI_3$. As shown in FIG. 3A, 70 mg of iodine 41 and a quartz tube 42 containing the monocrystalline $BiI_3$ crystals 34 were placed in a quartz tube 40 of 1 cm in inner diameter and 30 cm in length. After the quartz tube 40 was evacuated to a pressure of $5.0 \times 10^{-3}$ Pa and then sealed, the tube 40 was set in a two-zone electric furnace. In order to prevent the monocrystalline $BiI_3$ crystals 34 from coming into direct contact with the iodine 41, in the present example, the monocrystalline $BiI_3$ crystals 34 placed in the quartz tube 42 closed at one end were enclosed in the quartz tube 40. Then the monocrystalline $BiI_3$ crystals 34 were held for 2 hours under the conditions where both the control temperatures of the first heater 22, at which the iodine 41 and the monocrystalline $BiI_3$ crystals 34 were located, and the second heater 23 were set to 150° C. Thus the iodine 41 in the quartz tube 40 is sublimated, thereby heat-treating the monocrystalline $BiI_3$ crystals 34. According to the vapor pressure curve of iodine, the vapor pressure of iodine is $4.0 \times 10^{-2}$ MPa at 150° C. It is assumed, from a characteristic equation in consideration of the volume of the quartz tube 40, that 70 mg of iodine 41 was fully sublimated into vapor at 150° C. Then, the temperatures of the first and second heaters were reduced to room temperature, and the quartz tube 40 was taken out of the electric furnace. As the temperature decreased, the iodine vapor in the quartz tube 40 was turned into solid and iodine was thus deposited in the tube. In this operation, the cooling rate of the second heater 23 was set higher than that of the first heater 22 so that iodine 45 was deposited in the region where the monocrystalline $BiI_3$ crystals 34 were not located (right of the figure), as shown in FIG. 3B. The deposition of iodine on the surface of the second bismuth iodide can be reduced by setting one or some of a plurality of heaters, located with a longer distance from the second bismuth iodide so as to cool more rapidly than the other with a shorter distance from the second bismuth iodide.

Comparative Example

Monocrystalline $BiI_3$ was prepared using $BiI_3$ (purity: 99.99%) powder as the raw material through the steps of (1) and (2) in Example 1 (see FIGS. 2A to 2D). However, the resulting monocrystalline $BiI_3$ was not heat-treated (the step of (3) in Example 1 was not performed). Hence, the monocrystalline $BiI_3$ prepared in the Comparative Example is the first bismuth iodide in Example 1.

Example 2

Example 2 show the measurement results of response to X-ray radiation and the resistivity under dark conditions of the bismuth iodide article (second bismuth iodide) prepared in Example 1. In addition, the response to X-ray radiation and the resistivity under dark conditions of the monocrystalline $BiI_3$ prepared in the Comparative Example were measured in the same manner for comparison.

Figure 4:
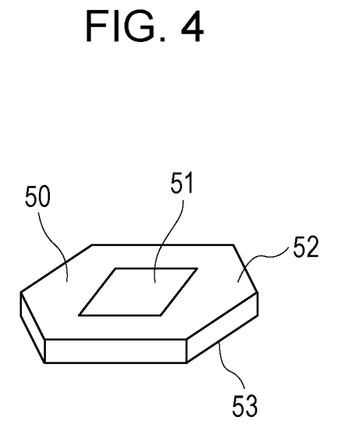
FIG. 4 is a diagrammatic representation illustrating the arrangement of electrodes on a bismuth iodide article.

As shown in FIG. 4, a bismuth iodide sample 50 was provided with a pair of graphite electrodes 51 of 2 mm by 2 mm in size on the upper surface 52 and the lower surface 53 (electrode on the lower surface is not shown). Then, the X-ray response characteristic of the sample was measured by irradiating the sample with X-ray radiation while a voltage was applied between the electrodes. In this measurement, the lower surface 53 of the sample is opposed to the upper surface 52. The bismuth iodide sample was irradiated with X-ray radiation under the conditions of a tube voltage of 60 kV and a tube current of 1 mA using an X-ray source including a tungsten target in such a manner that X-rays were narrowed with a collimator so that only a region of 1.6 mm in diameter on the surface of the upper electrode was irradiated. Changes in current caused by irradiation with X-ray radiation were taken into an oscilloscope through a current amplifier as pulses of response to X-ray radiation by switching irradiation and interruption of the irradiation by the switching operation of a shutter while a voltage of 2.5 V was applied between the upper and lower electrodes. The pulses were estimated as the X-ray response characteristic.

Figure 5:
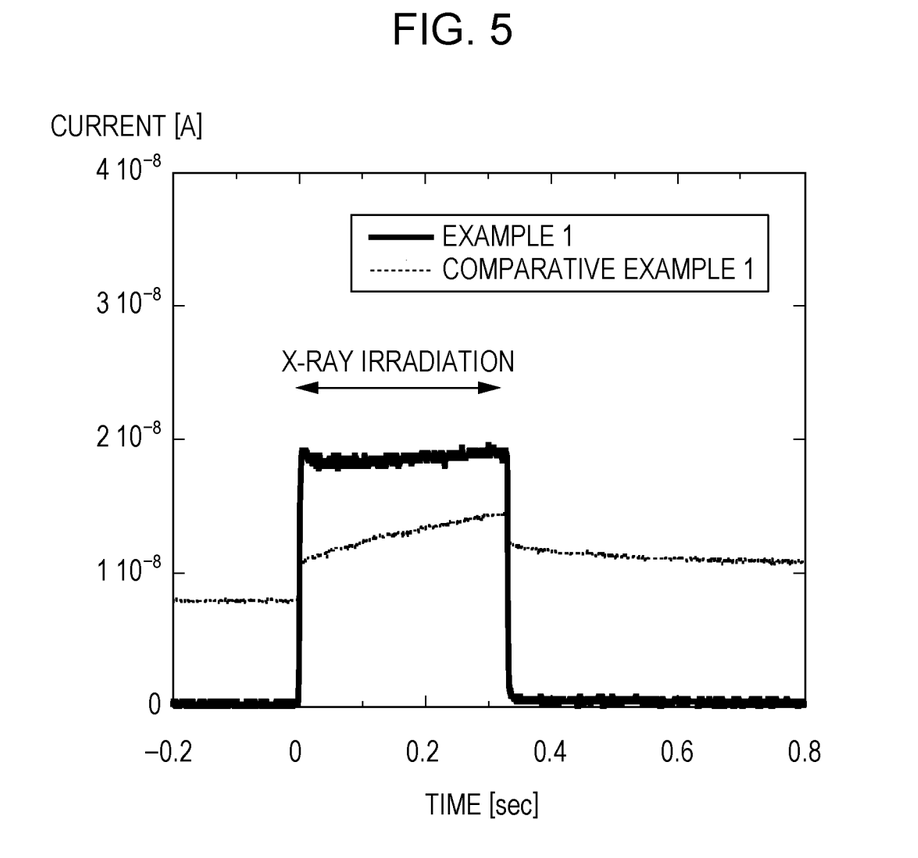
FIG. 5 is a graph of the responses to X-ray radiation of the bismuth iodide samples prepared in Example 1 and the Comparative Example.

FIG. 5 shows the X-ray response characteristics of the bismuth iodide samples prepared in Example 1 and the Comparative Example. The bismuth iodide sample of Example 1 exhibited a higher current than the bismuth iodide sample of the Comparative Example when irradiated with X-ray radiation, and a lower current (dark current) when not irradiated with X-ray radiation. The signal current was calculated by subtracting the current when irradiation was interrupted from the current when the sample was irradiated. The signal current and the resistivity under dark conditions, which was calculated using dark current, of each sample are shown in the following Table.

TABLE

| Sample | Thickness | Signal current | Resistivity under dark conditions |
|---|---|---|---|
| Example 1 | 150 μm | 20 nA | $1.7 \times 10^{12}$ Ωcm |
| Comparative Example | 100 μm | 3 nA | $1.9 \times 10^{9}$ Ωcm |

These results show that the $BiI_3$ crystals of Example 1 have higher resistivity and a higher signal current than the $BiI_3$ crystals of the Comparative Example.

Example 3

In Example 3, a radiation detector according to the second embodiment was examined. The second bismuth iodide prepared in the same manner as in Example 1 was used as the conversion layer of the radiation detector.

The second bismuth iodide was prepared through the steps of (1) to (3) in Example 1 in the same manner, and thus detailed description of these steps is omitted. However, the steps were different in the following: The step of (1) was performed twice, and thus monocrystalline $BiI_3$ crystals (first bismuth iodide) were prepared using $BiI_3$ powder containing less impurity than the $BiI_3$ used in Example 1. Also, the monocrystalline $BiI_3$ crystals prepared in the step of (2) were in the form of plates of about 4 mm on a side with a thickness of 100 μm. Furthermore, the heat treatment in the step of (3) was performed at 200° C. for 2 hours.

Subsequently, the monocrystalline second bismuth iodide was provided with a pair of gold (Au) electrodes 51 of 2 mm in diameter and 50 nm in thickness on the upper and the lower surface thereof by vacuum vapor deposition. Thus a radiation detecting element 103 was produced which included a monocrystalline bismuth iodide conversion layer 113 and a first and a second Au electrode 111 and 112.

Next, the response of the radiation detecting element 103 was examined using an X-ray source including a tungsten target. This examination was performed in a current mode. Irradiation with X-ray radiation was performed under the conditions of a tube voltage of 60 kV and a tube current of 1 mA in such a manner that X-rays were narrowed with a collimator so that only a region of 1.6 mm in diameter on the surface of the first electrode was irradiated. The signal current was measured while a bias voltage of 5 V was applied between the first and the second electrode of the radiation detecting element. The signal current was 50 nA. In addition, dark current was measured in a state where the sample was not irradiated with X-ray radiation, and the resistivity under dark conditions calculated using the measured dark current was $1.3 \times 10^{10}$ Ωcm.

Subsequently, the response of the sample to irradiation with γ-ray radiation was examined using γ-rays emitted from a radioisotope. This examination was performed in a pulse mode. Cd-109 was used as the radioisotope. The radiation detecting element produced above was used as the radiation detecting element of the radiation detector shown in FIG. 7, and was connected to the preamplifier, the bias supply, the main amplifier and the multichannel analyzer. The preamplifier was a charge-sensitive preamplifier. The pulsed signals from the preamplifier were input to the main amplifier for amplification and shaping with a CR shaping circuit and an RC shaping circuit. The output from the main amplifier is input to the multichannel analyzer, and the output from the multichannel analyzer was processed into a pulse height spectrum using a computer.

Figure 9:
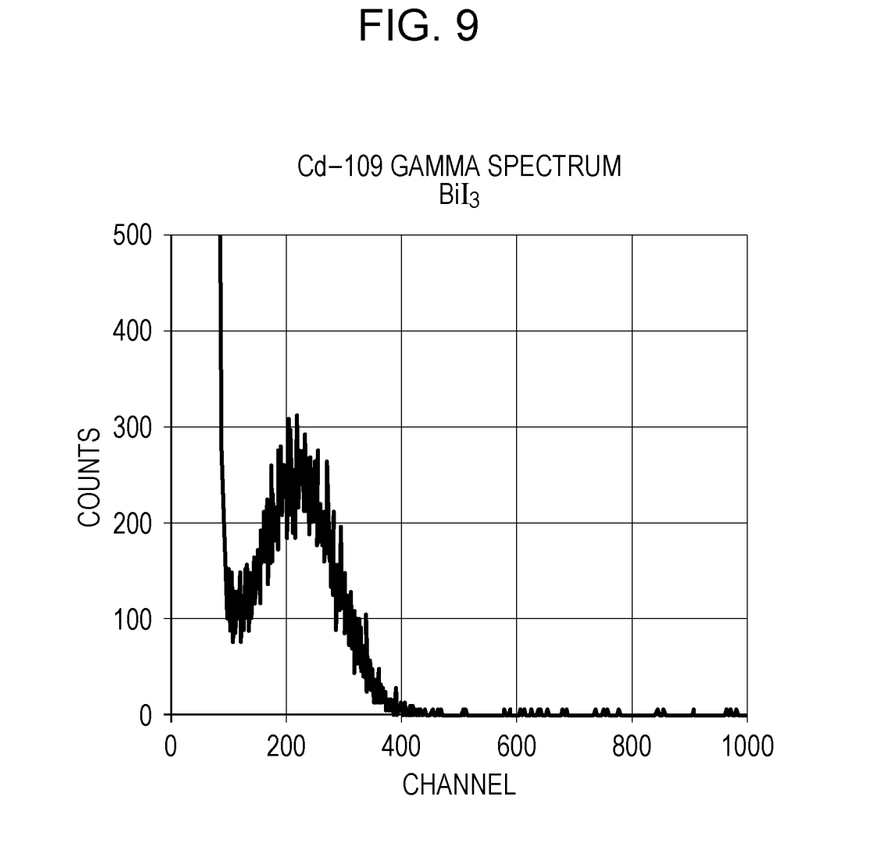
FIG. 9 is a pulse height spectrum of γ-ray radiation from a radiation source Cd-109, obtained using a radiation detector of an embodiment of the present invention.

The pulse height spectrum was shown in FIG. 9. A photo peak of γ rays of 22 keV emitted from Cd-109 ($^{109}$Cd) was observed at room temperature. The present inventors believe that this is the first case where a photo peak of γ-ray radiation was observed by a detector including a $BiI_3$ conversion layer.

For reference, Nuclear Instruments and Methods in Physics Research A 652 (2011) 166-169 (non-patent document) teaches a case where α-rays were detected using bismuth iodide. In this non-patent document, however, the object to be detected is limited to high-energy α-rays (5.5 MeV), and the document does not describe the detection of a photo peak of electromagnetic waves, particularly of X-rays or γ-rays.

As described above, the radiation detector of the present example can count photons of γ-ray radiation. Accordingly, γ-ray and X-ray radiation can be detected with a high S/N ratio. The radiation detector of Example 3 is expected to be widely used for application in medical practice, such as radiography.

Example 4

Example 4 is different from Example 3 in that response to irradiation with γ-ray radiation was examined using γ-rays from Am-241 ($^{241}$Am). The same radiation detector as in Example 3 was used, and thus description thereof will be omitted.

Figure 10:
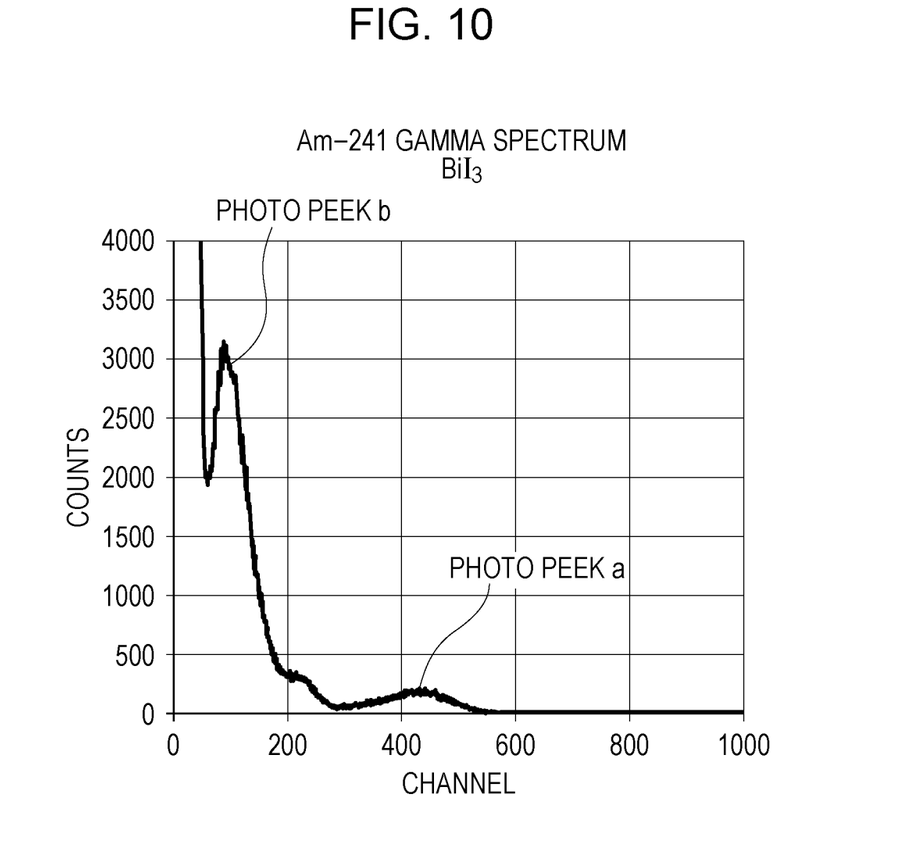
FIG. 10 is a pulse height spectrum of γ-ray radiation from a radiation source Am-241, obtained using a radiation detector of an embodiment of the present invention.

FIG. 10 shows a pulse height spectrum obtained in the present example. Photo peak a of γ rays of 59.5 keV (around a channel of 430) emitted from Am-241 was observed. Also, photo peak b of γ-rays of 20 keV (around a channel of 80) from Am-241 was observed. These two peaks were clearly separated.

These results suggest that the radiation detector of the present example can discriminate peaks of pulses and thus can detect γ-rays of 20 keV and 59.5 keV separately.

Hence, the radiation detector of the present example can detect radiations having different energies separately.

Example 5

In Example 5, impurities in the second bismuth iodide (monocrystalline $BiI_3$ crystals) prepared in Example 3 were analyzed. For this analysis, ICP-MS (Inductively Coupled Plasma Mass Spectrometry) was applied.

The impurity content in terms of Fe in the second bismuth iodide was as low as the detection limit and was 0.4 ppm or less. The results in Example 5 showed that the Fe content in the bismuth iodide was one digit or more lower than the value (in the range of 4 ppm to 7 ppm) reported in the above-cited non-patent document.

By using as a conversion layer the bismuth iodide article in which the Fe content has been reduced, the radiation detector exhibits good response characteristics as shown in Examples 3 and 4 and can detect photo peaks of γ-rays.

Example 6

Example 6 examined the carrier mobility of the conversion layer (second bismuth iodide) of the radiation detecting element of Example 3. The carrier mobility was examined using α-rays emitted from Am-241 of 5.5 MeV.

The radiation detecting element was connected to a bias supply and a charge-sensitive preamplifier in the same manner as in Example 3. However, Example 6 was different from Example 3 in that the preamplifier was connected to a digital oscilloscope so that the output from the preamplifier was input to the digital oscilloscope.

Figure 11A:
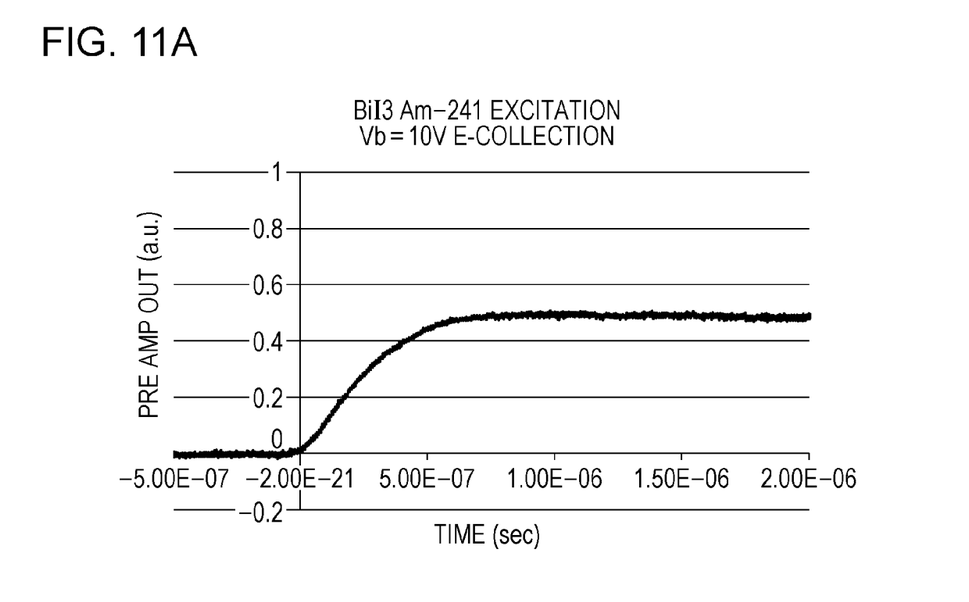
FIGS. 11A and 11B are graphs of the waveforms of output from a charge-sensitive preamplifier when α-ray radiation is emitted from a radiation source Am-241, obtained using a radiation detector of an embodiment of the present invention.
Figure 11B:
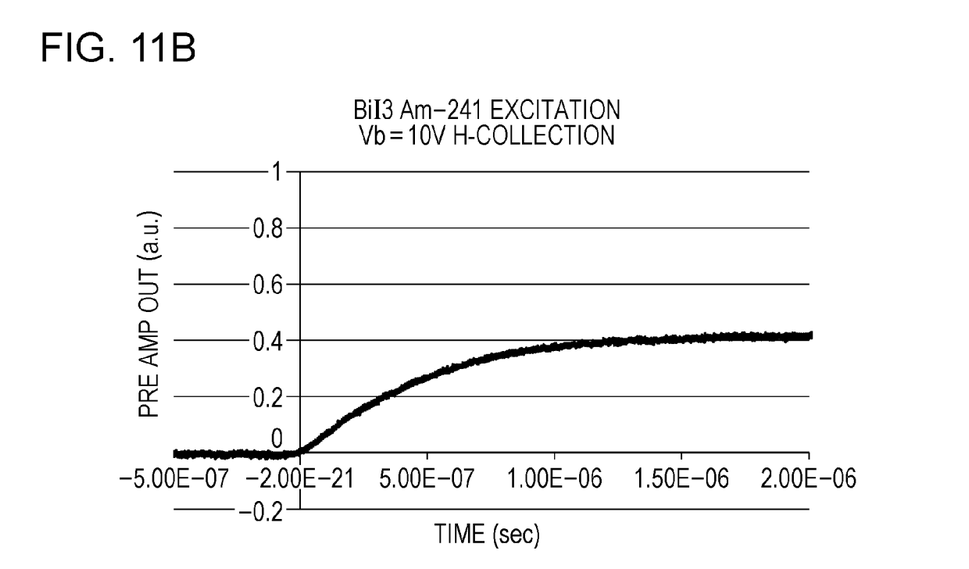

While the radiation detecting element was irradiated with α-ray radiation, the waveform of pulsed output from the charge-sensitive preamplifier was measured with the digital oscilloscope. FIGS. 11A and 11B show the waveforms of pulsed output measured at room temperature. FIG. 11A is a waveform at a bias voltage of +10 V; and FIG. 11B is a waveform at a bias voltage of −10 V. The waveform at a positive bias voltage is mainly a waveform of electron collection, and the waveform at a negative bias voltage is mainly a waveform of hole collection.

The pulsed waveform of FIG. 11A was subjected to fitting analysis using the following equation derived based on a charge collection model of a radiation detector, and thus the mobility of charges was calculated.

$$Q_e(t) = Q_0 \frac{\tau_e}{t_e}\left(1 - \exp\left(-\frac{t}{\tau_e}\right)\right) \quad \text{if } t < \left(1 - \frac{x}{L}\right)t_e$$

$$= Q_0 \frac{\tau_e}{t_e}\left(1 - \exp\left(-\left(1 - \frac{x}{L}\right)\frac{t_e}{\tau_e}\right)\right) \quad \text{if } t \geq \left(1 - \frac{x}{L}\right)t_e$$

$$t_e = \frac{L^2}{\mu_e V}$$

In the equations, t represents the period of time from the point of interaction, L represents the thickness of the conversion layer, x represents the distance of the position of interaction from the surface, and Qo represents the total amount of charges generated by the interaction. Also, τe represents the lifetime of carriers, V represents bias voltage, μe represents carrier mobility, and Qe(t) represents the amount of charges collected by the electrode for a period t.

Since the present example uses α-ray radiation, the position of interaction is limited to the region around the surface. For analysis, it was therefore assumed that x=0 holds true. The above equations refer to Semiconductors for Room temperature Nuclear Detector Applications p500, academic pres.

The electron mobility ($\mu e$) obtained by the fitting analysis of the waveform of pulses shown in FIG. 11A was 17 cm$^2$/Vsec and the lifetime τe of electron carriers was 0.5 μs. The μτ product of electrons was $8.5 \times 10^{-6}$ cm$^2$/V.

Similarly, fitting analysis was performed for the waveform shown in FIG. 11B. The hole mobility was 9 cm$^2$/Vsec and the lifetime τe of hole carriers was 0.5 μs. The μτ product of holes was $4.5 \times 10^{-6}$ cm$^2$/V.

In the present example, hole mobility/electron mobility=9/17=0.53 held true. A large difference between the results of the present example and the report of the above-cited non-patent document is that, in the present example, hole collection can be examined by detecting pulsed output from the preamplifier. In the present example, when hole collection was examined, pulses were clearly detected, as shown in FIG. 11B. In the present example, hole mobility/electron mobility was 0.53, showing that holes can be sufficiently collected. These results suggest that the radiation detector of the present example is particularly superior in hole transporting characteristic.

The value of hole mobility/electron mobility of the element in which a γ-ray photo peak was detected was larger than 1/10 as described above. In the element in which a γ-ray photo peak was not detected as in the Comparative Example, the value of hole mobility/electron mobility was 1/10 or less, or the hole mobility was not measured. Thus, it is assumed that radiation detecting elements including a bismuth iodide conversion layer exhibit good properties when the value of hole mobility/electron mobility is large. In particular, when the value of hole mobility/electron mobility is 1/10, photo peaks of γ-ray radiation can be detected, and photons can be counted.

Example 7

Another element prepared in the same manner as in Example 3 was evaluated in the same manner as in Example 6. In Example 7, the bismuth iodide crystals had a thickness of 75 μm. Purification by sublimation was performed twice at 400° C. for 10 hours. Crystal growth was performed at a temperature of 350° C. for 108 hours.

In the present example, a photo peak of γ ray radiation of 59.5 keV emitted from Am-241 was observed. The electron mobility ($\mu e$) was 1.4 cm$^2$/Vsec, and the lifetime τe of electron carriers was 3 μs, and μτ product of electrons was $4 \times 10^{-6}$ cm$^2$/V. Also, the hole mobility was 0.65 cm$^2$/Vsec, and the lifetime τe of hole carriers was 1.7 μs, and μτ product of holes was $1.1 \times 10^{-6}$ cm$^2$/V. In the present example, hole mobility/electron mobility was 0.46.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-234962, filed Nov. 13, 2013, No. 2014-099900, filed May 13, 2014, and No. 2014-210842, filed Oct. 15, 2014, which are hereby incorporated by reference herein in their entirety.

What is claimed is:

1. A bismuth iodide article comprising bismuth iodide having a hole mobility higher than 1/10 of the electron mobility thereof.

2. The bismuth iodide article according to claim 1, the having a Fe content of 1 ppm or less.

3. The bismuth iodide article according to claim 1, wherein the resistivity thereof is $1 \times 10^{10}$ Ωcm or more.

4. A radiation detecting element comprising: a conversion layer comprising a bismuth iodide; and a first and a second electrode electrically connected to the conversion layer, wherein the bismuth iodine has hole mobility higher than 1/10 of the electron mobility thereof.

5. A radiation detector comprising:
   a radiation detecting element; and
   a signal processing unit configured to read signals from the first and the second electrode, wherein the radiation detecting element has a conversion layer comprising a bismuth iodide and a first and a second electrode electrically connect to the conversion layer, and
   wherein the bismuth iodide has a hole mobility higher than 1/10 of the electron mobility thereof.

6. The radiation detector according to claim 5, having a Fe content of the bismuth iodide article of 1 ppm or less.

7. The radiation detector according to claim 5, wherein the signal processing unit counts photons of radiation.

8. The radiation detector according to claim 6, wherein the signal processing unit counts photons of radiation.

* * * * *